United States Patent
Shimamura

(10) Patent No.: US 8,014,114 B2
(45) Date of Patent: Sep. 6, 2011

(54) SEMICONDUCTOR INTEGRATED CIRCUIT

(75) Inventor: Tetsuo Shimamura, Ota (JP)

(73) Assignees: SANYO Electric Co., Ltd., Moriguchi-shi (JP); SANYO Semiconductor Co., Ltd., Ora-gun (JP)

( * ) Notice: Subject to any disclaimer, the term of this patent is extended or adjusted under 35 U.S.C. 154(b) by 290 days.

(21) Appl. No.: 12/268,709

(22) Filed: Nov. 11, 2008

(65) Prior Publication Data

US 2009/0128971 A1   May 21, 2009

(30) Foreign Application Priority Data

Nov. 15, 2007   (JP) ................. 2007-296256

(51) Int. Cl.
*H02H 9/00* (2006.01)
*H02H 1/00* (2006.01)
*H02H 1/04* (2006.01)
*H02H 3/22* (2006.01)

(52) U.S. Cl. .......................... 361/56; 361/118
(58) Field of Classification Search .............. 361/56
See application file for complete search history.

(56) References Cited

U.S. PATENT DOCUMENTS 7,110,228 B2 *   9/2006   Chang ..................... 361/56
7,491,584 B2 *   2/2009   Yu et al. ................. 438/128

FOREIGN PATENT DOCUMENTS

JP            7-58289         3/1995

* cited by examiner

*Primary Examiner* — Dharti H Patel
(74) *Attorney, Agent, or Firm* — Morrison & Foerster LLP

(57) ABSTRACT

The invention provides a semiconductor integrated circuit preventing an electrostatic breakdown due to a surge voltage applied to a power supply wiring or a ground wiring and preventing noise interference between a digital circuit and an analog circuit. By providing a first electrostatic breakdown protection diode and a first electrostatic breakdown protection bipolar transistor in a first island region, the first electrostatic breakdown protection diode and the first electrostatic breakdown protection bipolar transistor turn on when a surge voltage is applied to a first ground wiring and protect a digital circuit against an electrostatic breakdown. Furthermore, a first isolation layer is contacted with the first ground wiring in a position that is more adjacent to a first ground pad than the digital circuit, and a second isolation layer is contacted with a second ground wiring in a position that is more adjacent to a second ground pad than an analog circuit. This prevents noise interference between the digital circuit and the analog circuit.

14 Claims, 6 Drawing Sheets

SEMICONDUCTOR INTEGRATED CIRCUIT

CROSS-REFERENCE OF THE INVENTION

This application claims priority from Japanese Patent Application No. 2007-296256, the content of which is incorporated herein by reference in its entirety.

BACKGROUND OF THE INVENTION

1. Field of the Invention

The invention relates to a semiconductor integrated circuit, in particular, a technique for preventing an electrostatic breakdown of a multi-power supply semiconductor integrated circuit.

2. Description of the Related Art

An electrostatic breakdown protection device is provided in a semiconductor integrated circuit in order to prevent a breakdown (an electrostatic breakdown) due to a surge voltage such as a static electricity, an overvoltage, electromagnetic noises emitted from peripheral devices and so on. In particular, as a countermeasure for a case where a surge voltage is applied to a power supply wiring or a ground wiring, an electrostatic breakdown protection diode is connected between the power supply wiring and the ground wiring. Such a semiconductor integrated circuit is described in Japanese Patent Application Publication No. Hei 7-058289.

In recent years, a semiconductor integrated circuit where an analog circuit and a digital circuit are mounted together has been developed. In most of such semiconductor integrated circuits, the power supply voltage of the analog circuit and the power supply voltage of the digital circuit are different. In such a multi-power supply semiconductor integrated circuit, an electrostatic breakdown protection diode is connected between the power supply wiring and the ground wiring in each of the analog circuit and the digital circuit. However, depending on the position of the electrostatic breakdown protection diode, there is a problem that interference due to noises (hereafter, referred to as noise interference) occurs between the analog circuit and the digital circuit, leading to a malfunction or breakdown of the semiconductor integrated circuit.

SUMMARY OF THE INVENTION

The invention provides a semiconductor integrated circuit that includes a semiconductor substrate of a first general conductive type, a semiconductor layer of a second general conductive type formed on the semiconductor substrate, a first circuit formed on the semiconductor substrate, a first ground pad formed on the semiconductor substrate and receiving a ground voltage, a first ground wiring connecting the first ground pad and the first circuit and supplying the ground voltage to the first circuit, a first power supply wiring supplying a first power supply voltage to the first circuit, a first isolation layer of the first general conductivity type formed in the semiconductor layer so as to isolate part of the semiconductor layer from other part of the semiconductor layer as a first island region, and a first electrostatic breakdown protection diode formed between the first power supply wiring and the first ground wiring by connecting the first island region to the first power supply wiring. The first isolation layer is connected to the first ground wiring in a position that is closer to the first ground pad than to the first circuit. The circuit also includes a second circuit formed on the semiconductor substrate, a second ground pad formed on the semiconductor substrate and receiving the ground voltage, a second ground wiring connecting the second ground pad and the second circuit and supplying the ground voltage to the second circuit, a second power supply wiring supplying a second power supply voltage to the second circuit, a second isolation layer of the first general conductivity type formed in the semiconductor layer so as to isolate part of the semiconductor layer from other part of the semiconductor layer as a second island region, and a second electrostatic breakdown protection diode formed between the second power supply wiring and the second ground wiring by connecting the second island region to the second power supply wiring,

DETAILED DESCRIPTION OF THE INVENTION

Figure 1:
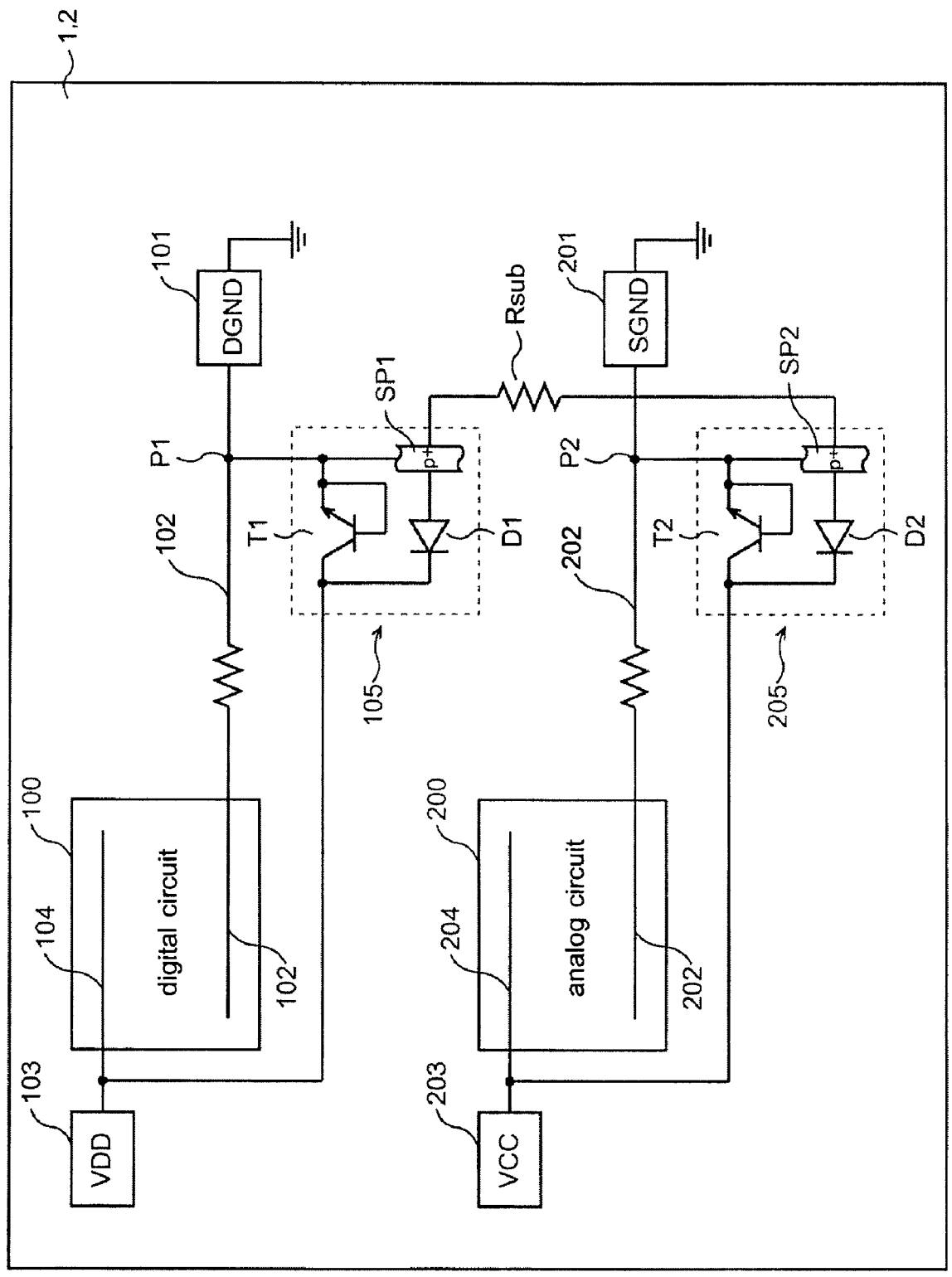
FIG. 1 is an equivalent circuit diagram showing a structure of a semiconductor integrated circuit of a first embodiment of the invention.

A semiconductor integrated circuit of a first embodiment of the invention will be described referring to figures. FIG. 1 is an equivalent circuit diagram of this semiconductor integrated circuit, also showing a physical positional relation between elements forming the semiconductor integrated circuit.

An N− type semiconductor layer 2 is formed over the whole surface of a P− type semiconductor substrate 1. The semiconductor layer 2 is formed by, for example, epitaxial growth. A digital circuit 100 (an example of a first circuit of the invention) and an analog circuit 200 (an example of a second circuit of the invention) are formed on this semiconductor layer 2.

A first ground pad 101 to which a ground voltage is applied and a first ground wiring 102 extending from the first ground pad 101 to the digital circuit 100 and supplying the ground voltage to the digital circuit 100 are further provided. A first power supply pad 103 to which a first power supply voltage VDD is applied and a first power supply wiring 104 extending from the first power supply pad 103 to the digital circuit 100 and supplying the first power supply voltage VDD to the digital circuit 100 are further provided.

Furthermore, a second ground pad 201 to which the ground voltage is applied and a second ground wiring 202 extending from the second ground pad 201 to the analog circuit 200 and supplying the ground voltage to the analog circuit 200 are provided. A second power supply pad 203 to which a second power supply voltage VCC is applied and a second power supply wiring 204 extending from the second power supply pad 203 to the analog circuit 200 and supplying the second power supply voltage VCC to the analog circuit 200 are further provided.

An N type first island region 105 is formed from the front surface of the semiconductor layer 2 to the inside of the semiconductor substrate 1, being isolated by a P+ type first isolation layer SP1. The first island region 105 is connected to the first power supply wiring 104 and the first isolation layer SP1 is connected to the first ground wiring 102, thereby forming a first electrostatic breakdown protection diode D1 between the first power supply wiring 104 and the first ground wiring 102. Furthermore, an NPN type first electrostatic breakdown protection bipolar transistor T1 is formed in the first island region 105, being connected between the first power supply wiring 104 and the first ground wiring 102. The first isolation layer SP1 is contacted with the first ground wiring 102 in a position P1 that is more adjacent to the first ground pad 101 than the digital circuit 100.

It is noted that conductivity types such as N+, N and N− belong in one general conductivity type, and conductivity types such as P+, P and P− belong in the other general conductivity type.

In the similar manner, an N type second island region 205 is formed from the front surface of the semiconductor layer 2 to the inside of the semiconductor substrate 1, being isolated by a P+ type second isolation layer SP2. The second island region 205 is connected to the second power supply wiring 204 and the second isolation layer SP2 is connected to the second ground wiring 202, thereby forming a second electrostatic breakdown protection diode D2 between the second power supply wiring 204 and the second ground wiring 202. Furthermore, an NPN type second electrostatic breakdown protection bipolar transistor T2 is formed in the second island region 205, being connected between the second power supply wiring 204 and the second ground wiring 202. The second isolation layer SP2 is contacted with the second ground wiring 202 in a position P2 that is more adjacent to the second ground pad 201 than the analog circuit 200. The first island region 105 is disposed more adjacent to the first ground pad 101 than the digital circuit 100, and the second island region 205 is disposed more adjacent to the second ground pad 201 than the analog circuit 200.

Figure 2A:
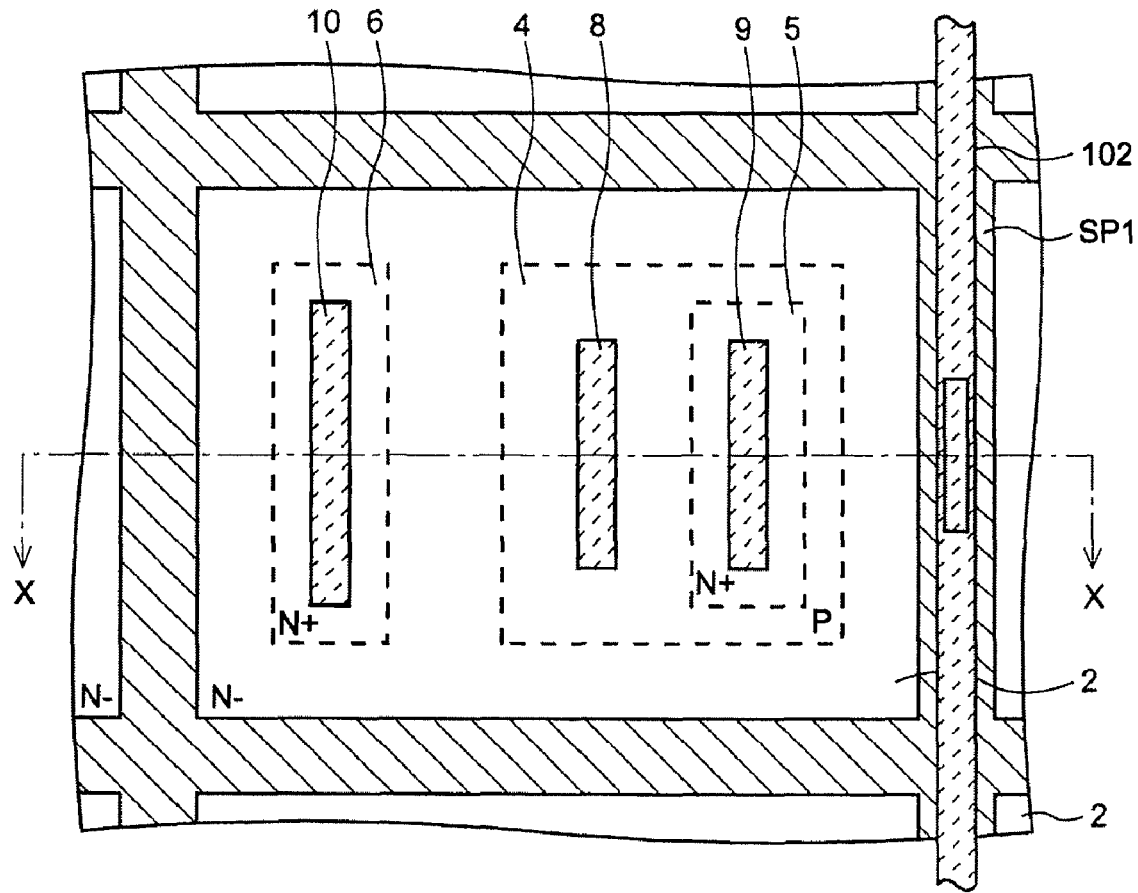
FIGS. 2A and 2B are a plan view and a cross-sectional view showing the structure of the semiconductor integrated circuit of the first embodiment of the invention.
Figure 2B:
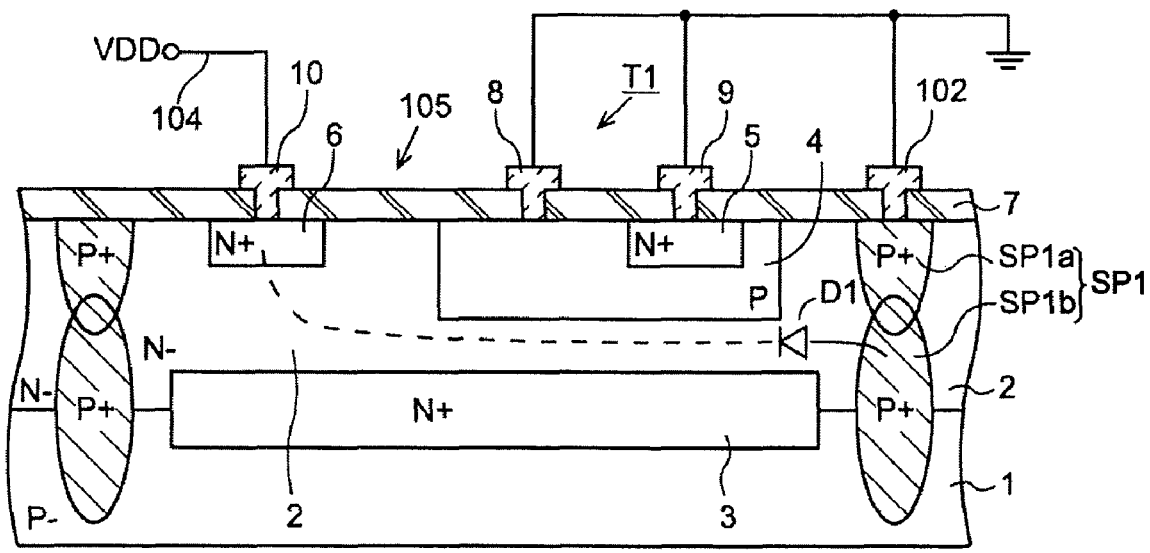

Hereafter, the more detailed structure of the first island region 105 will be described referring to FIGS. 2A and 2B. FIGS. 2A and 2B are views showing the structure of the first island region 105, and FIG. 2A is a plan view thereof and FIG. 2B is a cross-sectional view of FIG. 2A along line X-X. In this embodiment, the second island region 205 also has the same structure.

The N− type semiconductor layer 2 is formed on the front surface of the P type semiconductor substrate 1, and an N+ type embedded layer 3 having higher concentration than the semiconductor layer 2 is formed on the boundary of the semiconductor layer 2 and the semiconductor substrate 1. The semiconductor layer 2 and the embedded layer 3 are formed by implanting a high concentration of N type impurity (e.g. phosphorus) in the semiconductor substrate 1 and performing epitaxial growth.

The first electrostatic breakdown protection bipolar transistor T1 is formed on the front surface of the semiconductor layer 2. In detail, a P type impurity layer 4 is formed as a base region in a given region of the semiconductor layer 2, and an N+ type impurity layer 5 is formed as an emitter region on the front surface of the P type impurity layer 4.

An N+ type impurity layer 6 having higher concentration than the semiconductor layer 2 is further formed on the front surface of the semiconductor layer 2, and the semiconductor layer 2 and the N+ type impurity layer 6 form a collector region. An insulation film 7 (e.g. a silicon oxide film by a thermal oxidation method or a CVD method) is formed covering the semiconductor layer 2. Contact holes are formed in given regions of the insulation film 7, and a base electrode 8 connected to the P type impurity layer 4, an emitter electrode 9 connected to the N+ type impurity layer 5 and a collector electrode 10 connected to the N+ type impurity layer 6 are formed in the contact holes, respectively. The base electrode 8 and the emitter electrode 9 are connected to the first ground wiring 102, and the collector electrode 10 is connected to the first power supply wiring 104.

The P+ type first isolation layer SP1 for dividing the semiconductor layer 2 into a plurality of island regions is further formed. The first isolation layer SP1 is deeply formed from the front surface of the semiconductor layer 2 to the semiconductor substrate 1. In detail, the first isolation layer SP1 has a structure where an upper isolation layer SP1a and a lower isolation layer SP1b where P type impurities are added are partially overlapped and joined inside the semiconductor layer 2, and is annularly formed surrounding the region where the first electrostatic breakdown protection bipolar transistor T1 is formed.

The upper isolation layer SP1a is formed by diffusing a P type impurity such as boron (B) or the like from the upper surface of the semiconductor layer 2. The lower isolation layer SP1b is formed by diffusing a P type impurity such as boron (B) or the like from the bottom side of the semiconductor layer 2. Since adjacent devices divided by the first isolation layer SP1 are electrically isolated, various devices (a MOS transistor, a capacitor, other bipolar transistor or the like) are formed on the semiconductor layer 2 adjacent to the first electrostatic breakdown protection bipolar transistor T1.

A contact hole is further formed in a position of the insulation film 7 corresponding to the first isolation layer SP1, and the first ground wiring 102 is contacted with the first isolation layer SP1 through this contact hole. The contact position is the position P1 on the first ground wiring 102, that is more adjacent to the first ground pad 101 than the digital circuit 100 as described above. By providing this contact, the first electrostatic breakdown protection diode D1 using the first isolation layer SP1 and the semiconductor substrate 1 as an anode and the semiconductor layer 2 in first island region 105 and the N+ type impurity layer 6 as a cathode is formed between the first power supply wiring 104 and the first ground wiring 102.

As described above, by providing the first electrostatic breakdown protection diode D1 and the first electrostatic breakdown protection bipolar transistor T1, when a surge voltage is applied to the first ground wiring 102 and the voltage of the first ground wiring 102 becomes higher than the voltage of the first power supply wiring 104, the first electrostatic breakdown protection diode D1 and the first electrostatic breakdown protection bipolar transistor T1 turn on to flow a current from the first ground wiring 102 to the first power supply wiring 104 and protect the digital circuit 100 against an electrostatic breakdown. At this time, in particular, since the first electrostatic breakdown protection diode D1 has a large junction area and turns on in the forward direction, the protection effect is large.

Furthermore, since the first isolation layer SP1 is contacted with the first ground wiring 102 in the position P1 that is more adjacent to the first ground pad 101 than the digital circuit 100 and the second isolation layer SP2 is contacted with the second ground wiring 202 in the position P2 that is more adjacent to the second ground pad 201 than the analog circuit 200, mutual noise interference between the digital circuit 100 and the analog circuit 200 is prevented. In detail, as a result of the formation of the contact as described above, the first ground wiring 102 is connected to the semiconductor substrate 1 through the first isolation layer SP1, and the second ground wiring 202 is connected to the semiconductor substrate 1 through the second isolation layer SP2. This means that the first ground wiring 102 and the second ground wiring 202 are electrically connected through a parasitic resistance Rsub of the semiconductor substrate 1 as shown in FIG. 1.

However, since the first isolation layer SP1 is contacted with the first ground wiring 102 in the position P1 adjacent to the first ground pad 101 and the second isolation layer SP2 is contacted with the second ground wiring 202 in the position P2 adjacent to the second ground pad 201, both the voltage of the first position P1 and the voltage of the second position P2 are close to the ground voltage and thus hardly influenced by noises. For example, even if a switching noise occurs in the first ground wiring 102 by operation of the digital circuit 100, this switching noise is hardly observed in the position P1 of the first ground wiring 102. The switching noise occurring in the digital circuit 100 is thus prevented from being transferred to the second ground wiring 202 of the analog circuit 200.

Figure 6:
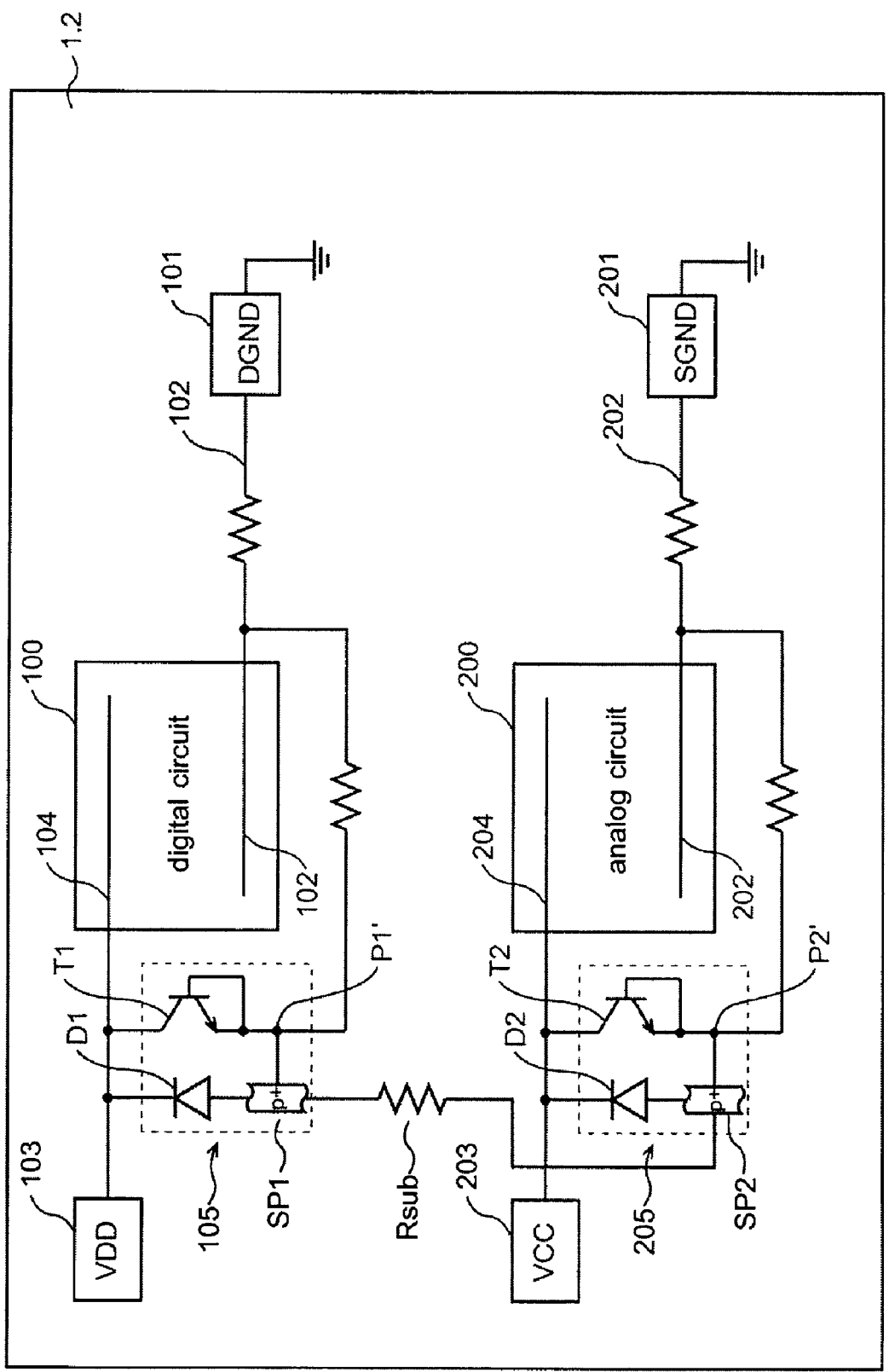
FIG. 6 is an equivalent circuit diagram showing a structure of a semiconductor integrated circuit of a reference example.

On the other hand, in a case where the first island region 105 is disposed adjacent to the digital circuit 100 and the second island region 205 is disposed adjacent to the analog circuit 200 as shown in FIG. 6, the first isolation layer SP1 is contacted with the first ground wiring 102 in a position P1' at a distance from the first ground pad 101 and the second isolation layer SP2 is contacted with the second ground wiring 202 in a position P2' at a distance from the second ground pad 201. This may cause, for example, a switching noise occurring in the digital circuit 100 to be transferred from the first ground wiring 102 to the second ground wiring 202 through the parasitic resistance Rsub of the semiconductor substrate 1 and cause a malfunction or breakdown of the analog circuit 200.

Figure 3:
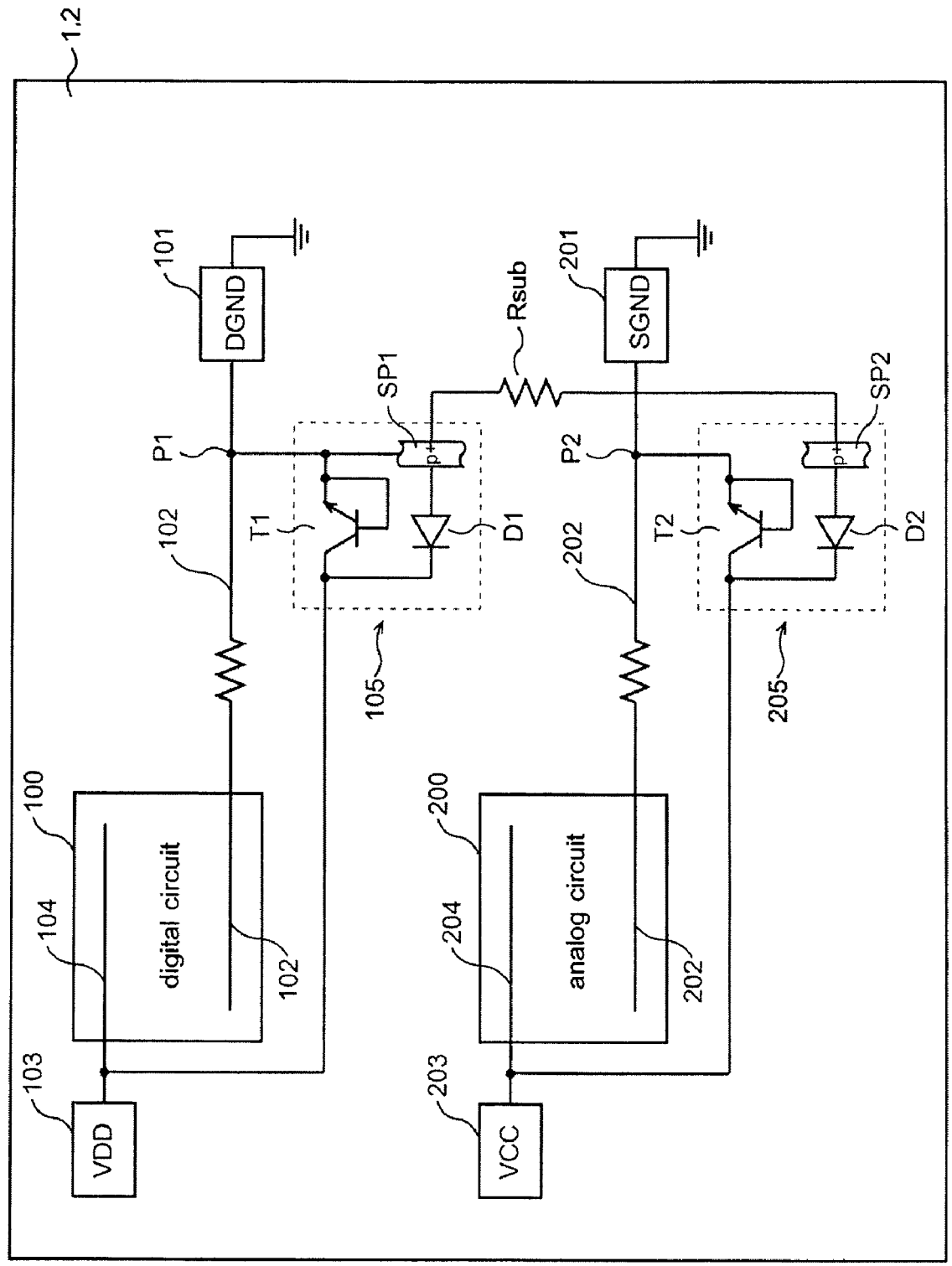
FIG. 3 is an equivalent circuit diagram showing a structure of a semiconductor integrated circuit of a second embodiment of the invention.

Next, a semiconductor integrated circuit of a second embodiment of the invention will be described referring to a figure. FIG. 3 is an equivalent circuit diagram of this semiconductor integrated circuit, also showing a physical positional relation between elements forming the semiconductor integrated circuit. This embodiment differs from the first embodiment in that the second isolation layer SP2 is not contacted with the second ground wiring 202 in the second island region 205. Therefore, the second electrostatic breakdown protection diode D2 is not connected to the second ground wiring 202, but this is connected to the first ground wiring 102 through the parasitic resistance Rsub of the semiconductor substrate 1, so that the effect as the electrostatic protection diode is achieved to some extent although it is lower than that of the first embodiment. Furthermore, since the first ground wiring 102 and the second ground wiring 202 are not connected through the parasitic resistance Rsub of the semiconductor substrate 1, noise interference between the first ground wiring 102 and the second ground wiring 202 is prevented.

It is noted that the same effect is obtained by forming a structure such that the second isolation layer SP2 is connected to the second ground wiring 202 in the second island region 205 and the first isolation layer SP1 is not connected to the first ground wiring 102 in the first island region 105 in a reverse manner to the above described structure.

Figure 4:
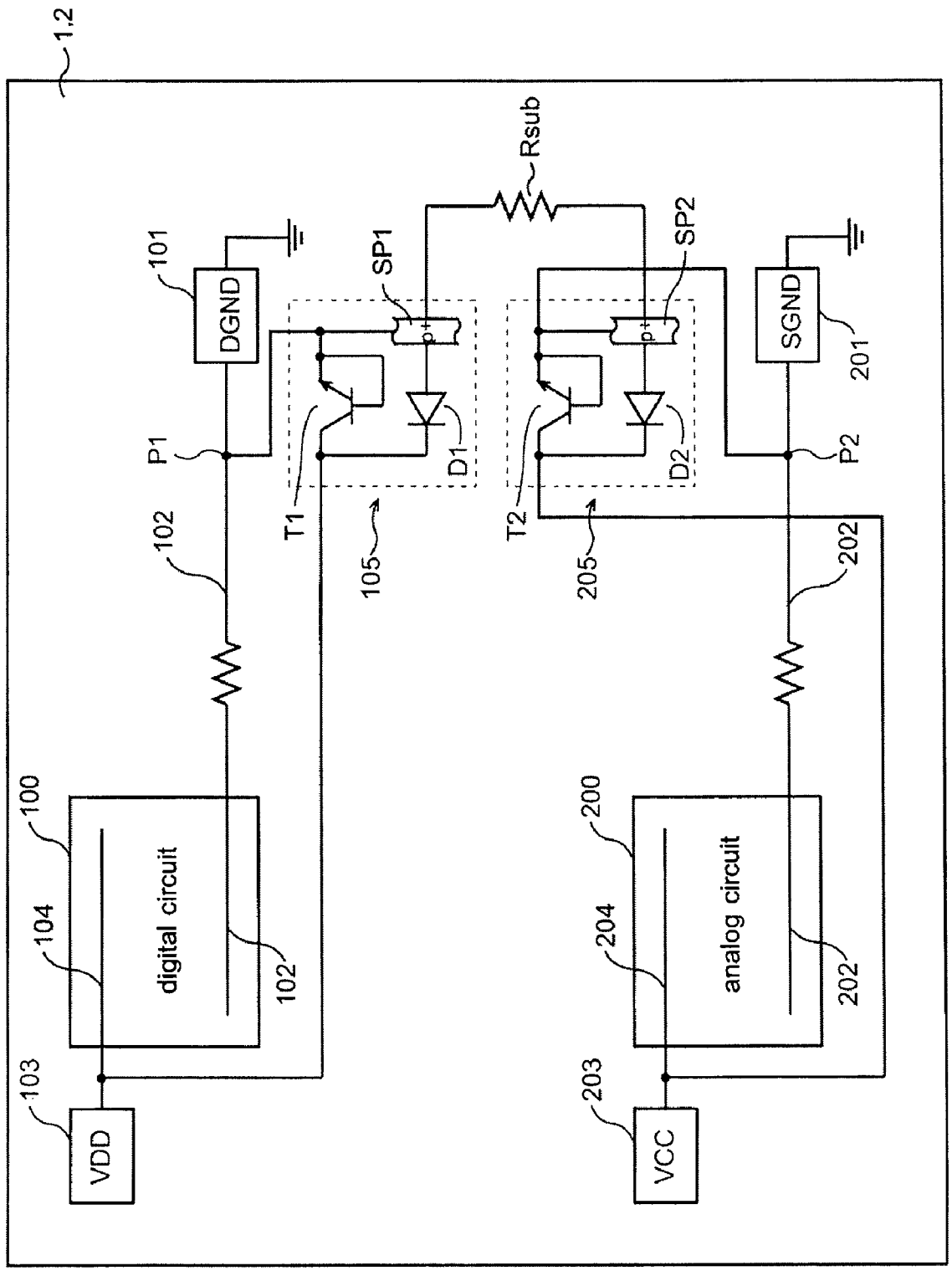
FIG. 4 is an equivalent circuit diagram showing a structure of a semiconductor integrated circuit of a third embodiment of the invention.

Next, a semiconductor integrated circuit of a third embodiment of the invention will be described referring to a figure. FIG. 4 is an equivalent circuit diagram of this semiconductor integrated circuit, also showing a physical positional relation between elements forming the semiconductor integrated circuit. In this embodiment, the first island region 105 and the second island region 205 are disposed between the first ground pad 101 and the second ground pad 201. The structure except this is the same as that of the first embodiment. According to this embodiment, increase of the die area of the semiconductor integrated circuit due to the formation of the first island region 105 and the second island region 205 is prevented by effectively utilizing a space between the first ground pad 101 and the second ground pad 201.

Figure 5:
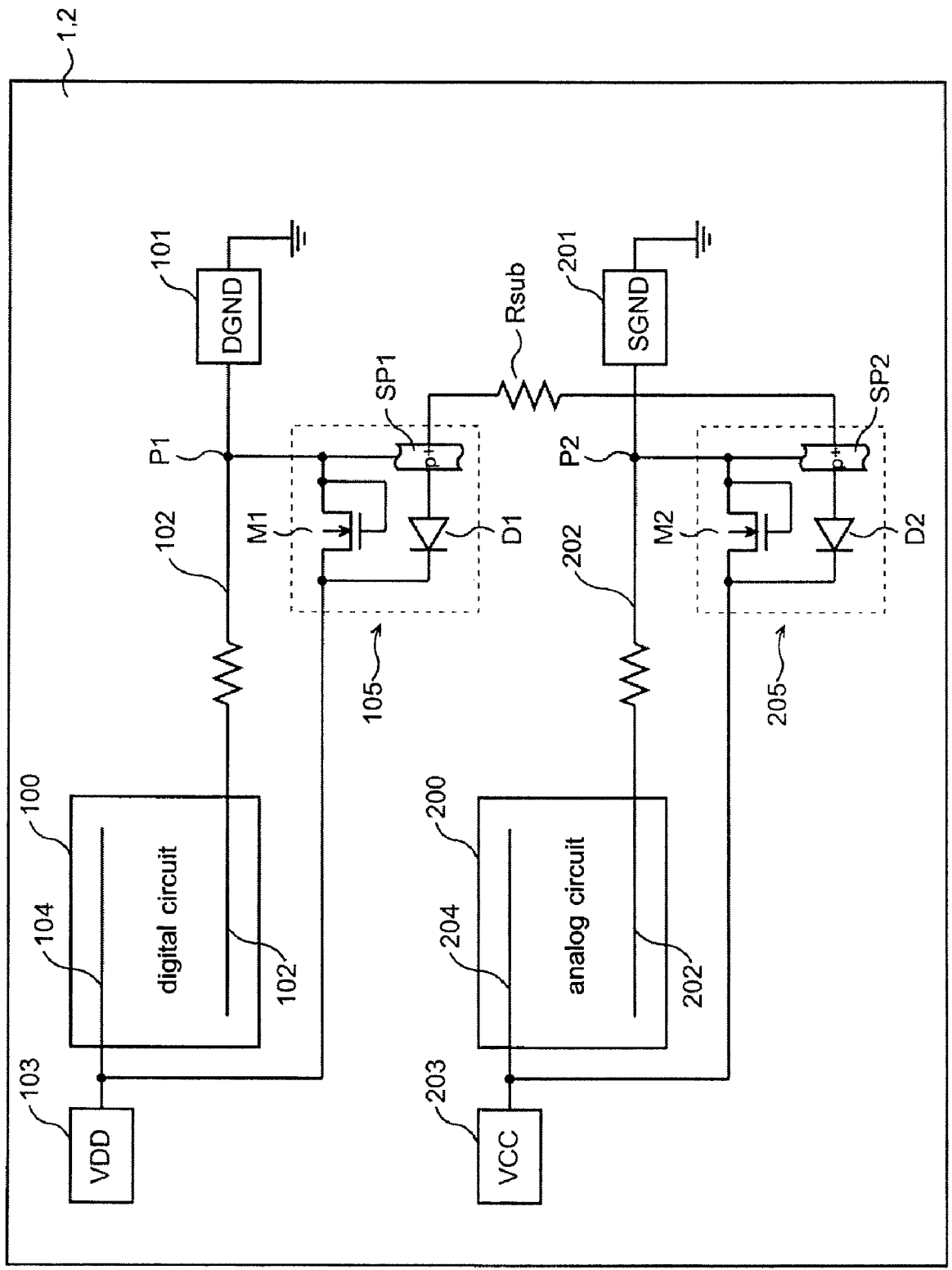
FIG. 5 is an equivalent circuit diagram showing a structure of a semiconductor integrated circuit of a fourth embodiment of the invention.

Next, a semiconductor integrated circuit of a fourth embodiment of the invention will be described referring to a figure. FIG. 5 is an equivalent circuit diagram of this semiconductor integrated circuit, also showing a physical positional relation between elements forming the semiconductor integrated circuit. In this embodiment, an N-channel type first electrostatic breakdown protection MOS transistor M1 is used instead of the first electrostatic breakdown protection bipolar transistor T1 of the first embodiment, and an N-channel type second electrostatic breakdown protection MOS transistor M2 is used instead of the second electrostatic breakdown protection bipolar transistor T2. The gate and source of the first electrostatic breakdown protection MOS transistor M1 are commonly connected to the first ground wiring 102, and the drain thereof is connected to the first power supply wiring 104. The gate and source of the second electrostatic breakdown protection MOS transistor M2 are commonly connected to the second ground wiring 202, and the drain thereof is connected to the second power supply wiring 204. It is noted that the first and second electrostatic breakdown protection MOS transistors M1, M2 may be of a P-channel type. It is also effective to use an electrostatic breakdown protection bipolar transistor and an electrostatic breakdown protection MOS transistor mixedly like T1 and M2 or M1 and T2 instead of T1 and T2.

The invention is not limited to the above described embodiments, and modification is possible within the scope of the invention. For example, although the digital circuit 100 is used as an example of the first circuit and the analog circuit 200 is used as an example of the second circuit, the invention is not limited to this and any circuit may be used as long as it is a circuit generating noises by operation. Furthermore, although the NPN-type first and second electrostatic breakdown protection bipolar transistors T1, T2 are described in the above embodiments, these may be of a PNP type and such a PNP type bipolar transistor is formed by forming a structure of a reverse conductive type to that shown in the above-described embodiments.

Such semiconductor integrated circuits prevent an electrostatic breakdown due to a surge voltage applied to the power supply wiring or the ground wiring, and prevents noise interference between the first circuit (e.g. a digital circuit) and the second circuit (e.g. an analog circuit), thereby preventing a malfunction or breakdown of the semiconductor integrated circuit.

What is claimed is:

1. A semiconductor integrated circuit comprising:
   a semiconductor substrate of a first general conductive type;
   a semiconductor layer of a second general conductive type formed on the semiconductor substrate;
   a first circuit formed on the semiconductor substrate;
   a first ground pad formed on the semiconductor substrate and receiving a ground voltage;
   a first ground wiring connecting the first ground pad and the first circuit and supplying the ground voltage to the first circuit;
   a first power supply wiring supplying a first power supply voltage to the first circuit;
   a first isolation layer of the first general conductivity type formed in the semiconductor layer so as to isolate part of the semiconductor layer from other part of the semiconductor layer as a first island region of the second general conductivity type;

a first electrostatic breakdown protection diode formed between the first power supply wiring and the first ground wiring by connecting the first island region to the first power supply wiring;

a second circuit formed on the semiconductor substrate;

a second ground pad formed on the semiconductor substrate and receiving the ground voltage;

a second ground wiring connecting the second ground pad and the second circuit and supplying the ground voltage to the second circuit;

a second power supply wiring supplying a second power supply voltage to the second circuit;

a second isolation layer of the first general conductivity type formed in the semiconductor layer so as to isolate part of the semiconductor layer from other part of the semiconductor layer as a second island region of the second general conductivity type; and a second electrostatic breakdown protection diode formed between the second power supply wiring and the second ground wiring by connecting the second island region to the second power supply wiring, wherein the first isolation layer is connected to the first ground wiring in a position that is closer to the first ground pad than to the first circuit.

2. The semiconductor integrated circuit of claim 1, wherein the second electrostatic breakdown protection diode is formed by connecting the second isolation layer to the second ground wiring in a position that is closer to the second ground pad than to the second circuit.

3. The semiconductor integrated circuit of claim 2, wherein the first electrostatic breakdown protection diode is disposed closer to the first ground pad than to the first circuit, and the second electrostatic breakdown protection diode is disposed closer to the second ground pad than to the second circuit.

4. The semiconductor integrated circuit of claim 2, wherein the first electrostatic breakdown protection diode and the second electrostatic breakdown protection diode are disposed between the first ground pad and the second ground pad.

5. The semiconductor integrated circuit of claim 2, further comprising a first electrostatic breakdown protection device formed in the first island region so as to be connected in parallel to the first electrostatic breakdown protection diode, and a second electrostatic breakdown protection device formed in the second island region so as to be connected in parallel to the second electrostatic breakdown protection diode.

6. The semiconductor integrated circuit of claim 5, wherein the first and second electrostatic breakdown protection devices comprise a bipolar transistor or a MOS transistor.

7. The semiconductor integrated circuit of claim 1, wherein the first electrostatic breakdown protection diode is disposed closer to the first ground pad than to the first circuit, and the second electrostatic breakdown protection diode is disposed closer to the second ground pad than to the second circuit.

8. The semiconductor integrated circuit of claim 1, wherein the first electrostatic breakdown protection diode and the second electrostatic breakdown protection diode are disposed between the first ground pad and the second ground pad.

9. The semiconductor integrated circuit of claim 1, further comprising a first electrostatic breakdown protection device formed in the first island region so as to be connected in parallel to the first electrostatic breakdown protection diode, and a second electrostatic breakdown protection device formed in the second island region so as to be connected in parallel to the second electrostatic breakdown protection diode.

10. The semiconductor integrated circuit of claim 9, wherein the first and second electrostatic breakdown protection devices comprise a bipolar transistor or a MOS transistor.

11. The semiconductor integrated circuit of claim 1, wherein the second electrostatic breakdown protection diode is formed by connecting the second isolation layer to the first ground wiring through the semiconductor substrate, and the second isolation layer is not connected to the second ground wiring.

12. The semiconductor integrated circuit of claim 1, further comprising another ground wiring connecting the first isolation layer and the position of the first ground wiring, wherein the another ground wiring is physically in contact with the first isolation layer.

13. A semiconductor integrated circuit comprising:

a semiconductor substrate of a first general conductive type;

a semiconductor layer of a second general conductive type formed on the semiconductor substrate;

a circuit formed on the semiconductor substrate;

a ground pad formed on the semiconductor substrate and receiving a ground voltage;

a ground wiring connecting the ground pad and the circuit and supplying the ground voltage to the circuit;

a power supply wiring supplying a power supply voltage to the circuit;

an isolation layer of the first general conductivity type formed in the semiconductor layer so as to isolate part of the semiconductor layer from other part of the semiconductor layer as an island region of the second general conductivity type;

an electrostatic breakdown protection diode formed between the power supply wiring and the ground wiring by connecting the island region to the power supply wiring;

wherein the isolation layer is connected to the ground wiring in a position that is closer to the ground pad than to the circuit.

14. The semiconductor integrated circuit of claim 13, further comprising another ground wiring connecting the isolation layer and the position of the ground wiring, wherein the another ground wiring is physically in contact with the isolation layer.

* * * * *